(12) United States Patent
Elsayed et al.

(10) Patent No.: US 6,281,758 B1
(45) Date of Patent: Aug. 28, 2001

(54) DIFFERENTIAL LC-VCO, CHARGE PUMP, AND LOOP FILTER ARCHITECTURE FOR IMPROVED NOISE-IMMUNITY IN INTEGRATED PHASE-LOCKED LOOPS

(75) Inventors: Ayman M. Elsayed, Waterloo (CA); Akbar Ali, Garden Grove, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/409,509

(22) Filed: Sep. 30, 1999

(51) Int. Cl.[7] .............................. H03B 5/12; H03L 7/093; H03L 7/099
(52) U.S. Cl. .......................... 331/16; 331/17; 331/36 C; 331/117 FE; 331/177 V
(58) Field of Search .................................... 331/17, 36 C, 331/16, 117 R, 117 FE, 167, 177 V

(56) References Cited

U.S. PATENT DOCUMENTS

| | | | |
|---|---|---|---|
| 5,187,450 | * | 2/1993 | Wagner et al. ..................... 331/36 C |
| 5,694,092 | * | 12/1997 | Oba et al. ........................ 331/177 V |
| 5,937,340 | * | 8/1999 | Philippe et al. .................. 331/177 V |

* cited by examiner

Primary Examiner—Siegfried H. Grimm

(74) Attorney, Agent, or Firm—Mintz, Levin, Cohn, Ferris, Glovsky and Popeo, P.C.

(57) ABSTRACT

A differential LC-based voltage-controlled oscillator (LC-VCO), charge pump and loop filter architecture for providing improved noise immunity in integrated phase-locked loops (PLLs). A pair of voltage control signals are provided from a differential charge pump and loop filter architecture to respective voltage control inputs in the LC-VCO to differentially control the LC-VCO. The voltage control inputs are connected to respective terminals on opposite ends of a varactor tuning circuit. The differential voltage applied across the varactor tuning circuit determines the LC characteristics of the varactor tuning circuit which, in turn, determines the operating frequency of the VCO. One of the voltage control inputs is passed through an operational amplifier buffering stage before being transmitted to its respective terminal in the varactor tuning circuit. The LC-VCO utilizes a PMOS transistor core to provide good substrate isolation and low flicker (1/f) noise. The PMOS core further eliminates parasitic diode problems while maintaining the whole supply range for tuning. The differentially-controlled LC-VCO is integrated into a PLL using a differential charge pump having a simple common mode correction circuit which does not require a clean reference signal. The differential LC-VCO and charge pump architecture of the present invention reduces the sensitivity of the components to supply, ground, and substrate noise without a significant increase in power consumption and without sacrificing the tuning range of the LC-VCO.

31 Claims, 6 Drawing Sheets

DIFFERENTIAL LC-VCO, CHARGE PUMP, AND LOOP FILTER ARCHITECTURE FOR IMPROVED NOISE-IMMUNITY IN INTEGRATED PHASE-LOCKED LOOPS

BACKGROUND OF THE INVENTION

1. Field of the Invention

The present invention relates generally to improving noise-immunity in an integrated phase-locked loop (PLL), and specifically to integrating a differentially-controlled LC-voltage-controlled oscillator (VCO), charge pump, and loop filter architecture into a PLL.

2. Description of Related Art

High performance voltage-controlled oscillators (VCOs) are critical components in high bit rate transmission systems. These VCOs are the heart of any phase-locked loop (PLL) based frequency synthesizer. As such, the VCO consumes a major fraction of the overall power of the frequency synthesizer, and the performance of the VCO determines to a large extent the performance of the whole synthesizer. The VCO basically functions as a frequency generator for the PLL. A typical PLL 10 is illustrated in FIG. 1 consisting of a phase detector 12, charge pump 14, loop filter 16, and VCO 18, where a frequency divider is often positioned after the VCO 18 as well. Several LC-VCO designs fully integrated into a PLL are known which are tuned by combining multiple resonators or by using varactors. In a fully integrated VCO, the tuning range should be large enough to cover for the frequency variations over temperature and process corners. For a typical control voltage from 0 to 3 volts, this results in a very large VCO gain. This high VCO gain increases the sensitivity of the VCO to supply, ground, and substrate noise, which makes it very difficult to integrate the VCO with other noisy components on the same chip.

In order to reduce the sensitivity of the VCO to the noise generated by other circuits sharing the same substrate and/or supply, it is highly desirable to have a differentially controlled VCO. There are several types of VCO's, including relaxation oscillators, ring oscillators, and LC-tuned oscillators. The principle of differential control has been used in both ring and relaxation type oscillators. In these types of oscillators, the frequency is usually controlled by changing a bias current, which can easily be done differentially in an integrated environment without sacrificing the tuning range. The situation is different for LC-based VCO's, where a single ended control input is commonly used as a reverse bias for a PN diode used as a varactor. FIG. 2 illustrates a common architecture for an integrated NMOS LC-based VCO. The nature of varactor diodes available in a CMOS process causes a major drawback to the type of architecture shown in FIG. 2. The varactor in a typical CMOS technology is built by diffusing a $P^+$ region over an N-well, producing the parasitic vertical PNP transistor available in such process. This varactor structure has the problem of having the N-well to P-substrate junction diode hanging on the sensitive tank circuit point, which adds a huge parasitic capacitance to the circuit. This capacitance is untunable and severely reduces the tuning range of the LC-VCO. This architecture also has the drawback that the parasitic capacitance is biased from $V_{dd}$ to the substrate which increases the oscillation frequency sensitivity to supply fluctuations which defines the frequency pushing characteristics of the VCO.

In order to alleviate the parasitic junction diode problem and facilitate a differential control for the VCO, circuits utilizing decoupling capacitors $C_{d1}$ and $C_{d2}$ have been used to decouple the varactors from the circuit's direct current (DC), as shown in FIG. 3. The varactor is then biased by the differential control inputs $V_{ctl1}$ and $V_{ctl2}$. The AC decoupling resistors $R_{ctl1}$ and $R_{ctl2}$ are necessary to isolate the two differential RF output nodes. These decoupling resistors should be large enough to minimize their loading effect on the VCO RF output while being as low as possible to minimize their noise contribution to the varactor modulation. The polarity of the varactor diodes can be chosen to avoid the effect of the parasitic diodes by connecting them to the virtual ground at $V_{ctl1}$. The decoupling capacitors $C_{d1}$ and $C_{d2}$ are designed to be large enough to reduce their effect on the varactor capacitance seen by the tank. However, the parasitic capacitance added to the tank due to the bottom plate capacitance of these large decoupling capacitors is a considerable portion of the main capacitor and hangs in parallel with the main tank circuit, which also reduce the tuning range of the LC-VCO. This makes this type of architecture undesirable for a typical process, where the achievable tuning range using a control voltage from 0 to 3.0 volts is less than the frequency variations due to process tolerances. Thus, prior attempts at differentially controlling an LC-VCO have resulted in a reduction in the varactor tuning range. This reduction in the varactor tunability increases the required VCO power consumption in order to maintain the same tuning range without degrading the phase noise performance.

There is a need for a PLL having a differentially controlled LC-VCO which does not significantly increase PLL power consumption and which also does not sacrifice the tuning range of the LC-VCO. Moreover, there is a need for a differentially controlled LC-VCO and associated differential charge pump architecture implemented in a PLL which provides improved immunity to supply, ground, and substrate noise.

OBJECTS AND SUMMARY OF THE INVENTION

It is a primary object of the present invention to overcome the aforementioned shortcomings associated with the prior art.

The present invention provides a system and method for providing a differentially-controlled LC-based voltage controlled oscillator (VCO).

The present invention provides a differentially-controlled LC-VCO which does not require a significant increase in power consumption over single ended LC-VCO's while still maintaining the tuning range of the LC-VCO.

The differentially-controlled LC-VCO of the present invention is integrated into a phase-locked loop (PLL) using a differential charge pump with a simple common mode correction circuit without requiring a clean reference signal.

The differentially-controlled LC-VCO of the present invention reduces the sensitivity of the PLL to supply, ground, and substrate noise.

The differentially-controlled LC-VCO of the present invention utilizes PMOS transistors for the VCO core to eliminate parasitic diode problems while maintaining the whole supply range for tuning.

These as well as additional advantages of the present invention are achieved by providing an LC-based VCO having a pair of voltage control inputs to differentially control the VCO. The voltage control inputs are connected to respective terminals on opposite ends of a varactor tuning circuit, where the differential voltage applied across the varactor tuning circuit determines the LC characteristics of the varactor tuning circuit which, in turn, determines the operating frequency of the VCO. One of the voltage control inputs is directly connected to its respective terminal, while the other voltage control input is passed through an operational amplifier buffering stage before being transmitted to its respective terminal in the varactor tuning circuit. The differentially-controlled LC-VCO is integrated into a PLL using a differential charge pump having a simple common mode correction circuit which does not require a clean reference signal. The differential LC-VCO and charge pump architecture of the present invention reduces the sensitivity of the components to supply, ground, and substrate noise.

The transistor core of the LC-VCO utilizes PMOS transistors in a cross-coupled differential pair to provide good substrate isolation and substantially lower flicker (1/f) noise over traditionally used NMOS transistors. The PMOS core further eliminates any parasitic diode problems while maintaining the whole supply range for tuning. The differentially-controlled LC-VCO of the present invention achieves the above-described noise immunity without any significant increase in power consumption and without sacrificing the tuning range of the LC-VCO.

BRIEF DESCRIPTION OF THE DRAWINGS

The features of the present invention, which are believed to be novel, are set forth with particularity in the appended claims. The present invention, both as to its organization and manner of operation, together with further advantages, may best be understood by reference to the following description, taken in connection with the accompanying drawings in which the reference numerals designate like parts throughout the figures thereof and wherein:

DETAILED DESCRIPTION OF THE PREFERRED EMBODIMENTS

The following description is provided to enable any person skilled in the art to make and use the invention and sets forth the best modes contemplated by the inventors of carrying out their invention. Various modifications, however, will remain readily apparent to those skilled in the art, since the general principles of the present invention have been defined herein specifically to provide a differentially controlled LC-VCO, charge pump, and loop filter architecture integrated into a PLL for improved noise immunity.

Figure 1:
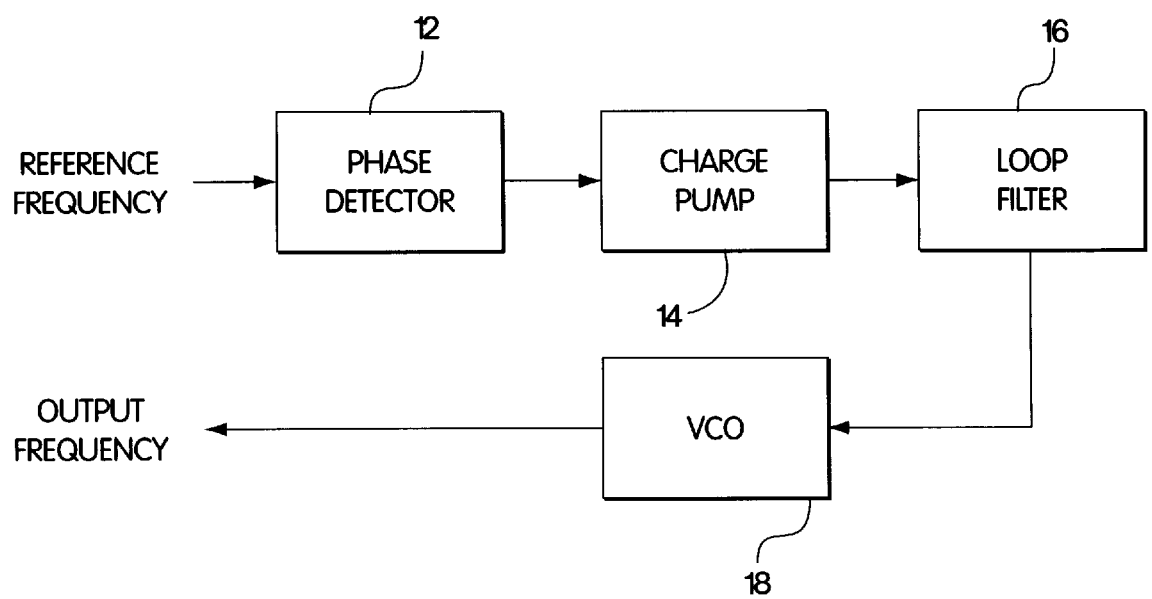
FIG. 1 is a block diagram of the components of a typical phase-locked loop (PLL)
Figure 2:
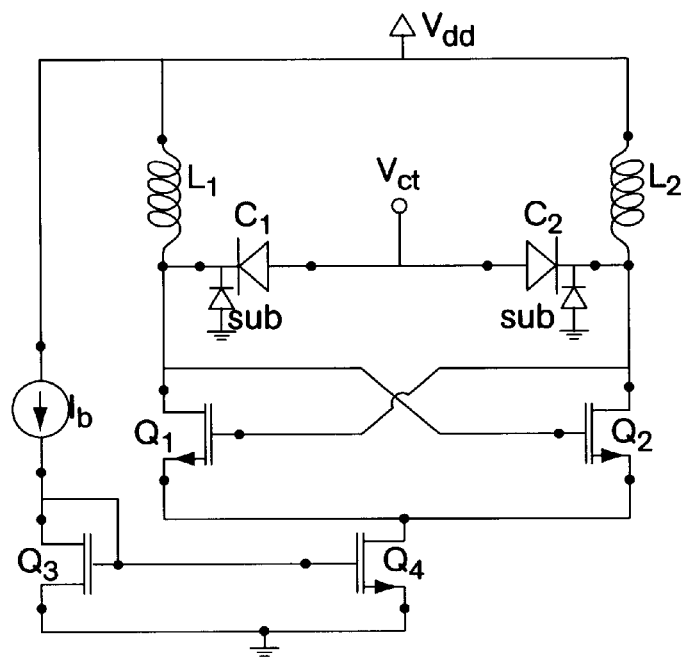
FIG. 2 is a schematic illustration of a conventional integrated NMOS LC-based VCO.
Figure 3:
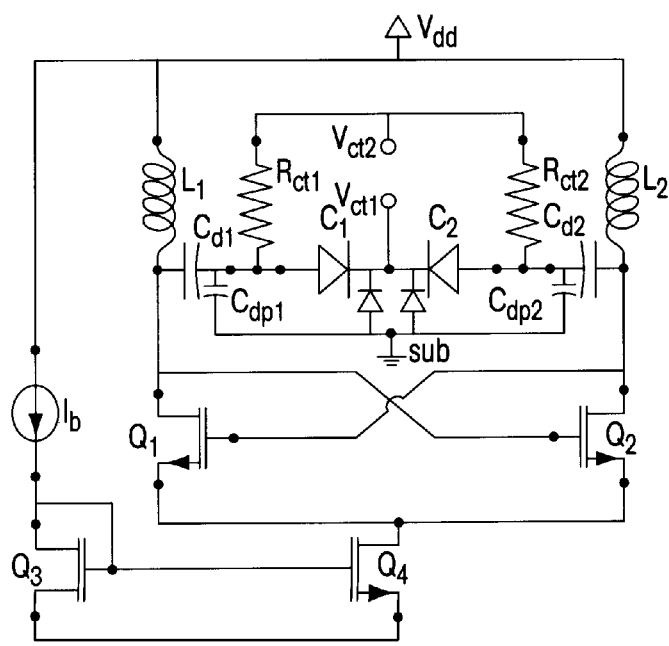
FIG. 3 is a schematic illustration of a conventional differential LC-VCO utilizing decoupling capacitors.
Figure 4:
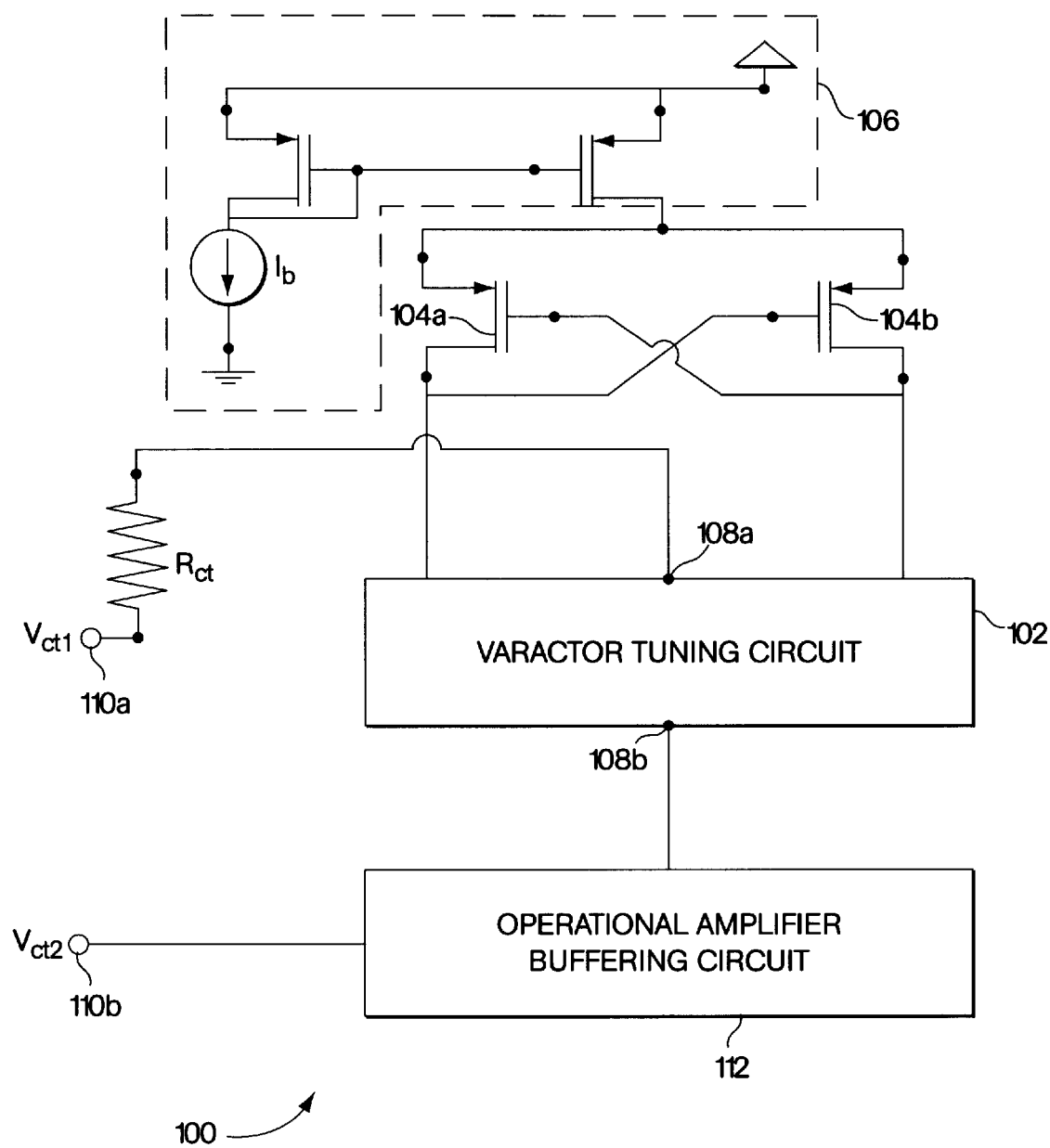
FIG. 4 is a schematic illustration of a preferred embodiment of the differentially-controlled LC-VCO of the present invention.

Referring now to FIG. 4, a schematic illustration of a preferred embodiment of the LC-VCO 100 of the present invention is shown. The LC-VCO 100 includes a varactor tuning circuit 102 for controlling the operating frequency generated by the LC-VCO 100. The varactor tuning circuit 102 is connected through nodes 109a and 109b to receive the output from a pair of cross-coupled transistors 104a and 104b which serve as the core of the LC-VCO 100. The cross-coupled transistors 104a and 104b are further connected to a current source 106. The varactor tuning circuit 102 includes a pair of terminals or nodes 108a and 108b on respective ends of the varactor tuning circuit 102, where the terminals 108a and 108b are connected to receive voltage control signals $V_{ct1}$ and $V_{ct2}$ from voltage inputs 110a and 110b, respectively. The capacitance of the varactor tuning circuit 102 is dependent upon the values of the voltage control signals $V_{ct1}$, $V_{ct2}$ supplied from voltage inputs 110a and 110b, where the LC characteristics of the varactor tuning circuit 102 determine the operating frequency of the LC-VCO 100. Since the inductance of the varactor tuning circuit 102 remains fixed, the LC characteristics of the varactor tuning circuit 102 are variably controlled by varying the capacitance of the varactor tuning circuit 102. Thus, the differential voltage control signals $V_{ct1}$, $V_{ct2}$ are used to variably control the operating frequency characteristics of the LC-VCO 100.

Figure 5:
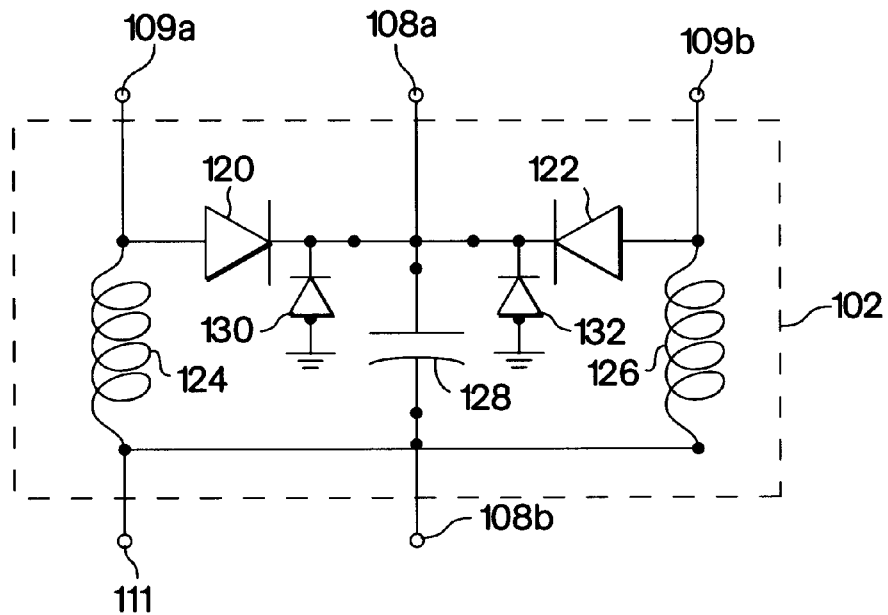
FIG. 5 is a schematic circuit illustration of a preferred embodiment of the varactor tuning circuit of FIG. 4.

Differential control of the varactor tuning circuit 102 is provided by applying a differential voltage across terminals 108a, 108b with voltage control signals $V_{ct1}$, $V_{ct2}$, respectively. Terminal 108a is connected through resistance $R_{ct}$ to voltage input 110a, while the voltage control signal $V_{ct2}$ from voltage input 110b is coupled to terminal 108b through an operational amplifier buffering circuit 112. The sensitivity of the LC-VCO 100 to supply, ground, and substrate noise is reduced by using differential control. As shown in FIG. 5, the varactor tuning circuit 102 preferably includes a pair of varactors 120 and 122 connected to a pair of corresponding inductors 124 and 126. Varactors 120 and 122 are connected in a front-to-front manner through terminal 108a, where inductors 124 and 126 are connected between varactors 120 and 122, respectively, and terminal 108b. A filtering capacitor 128 is positioned between terminals 108a and 108b to attenuate RF frequency noise. Furthermore, diodes 130 and 132 are positioned between varactors 120 and 122, respectively, and the substrate on which the LC-VCO 100 is formed. The parasitic effect of diodes 130 and 132 is reduced by the manner in which diodes 130 and 132 are positioned. The varactor tuning circuit 102 is connected to the operational amplifier buffering circuit through nodes 108b and 111. The voltage control signals $V_{ct1}$, $V_{ct2}$ are transferred to terminals 108a and 108b in a common mode, so that the voltage control signals $V_{ct1}$, $V_{ct2}$ will fluctuate together in the same manner.

Figure 6:
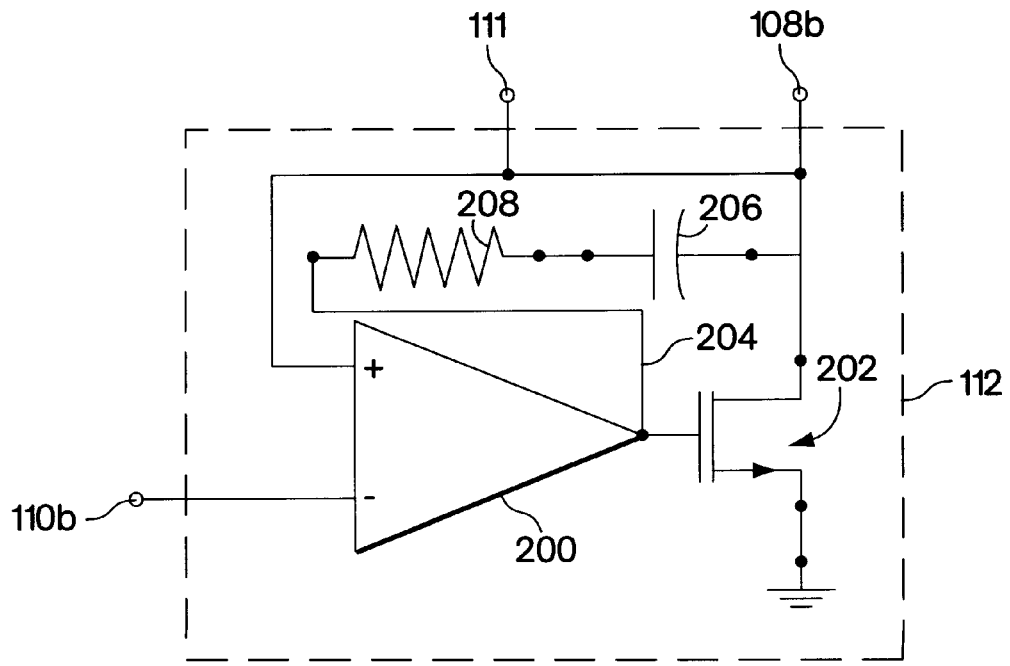
FIG. 6 is a schematic circuit illustration of a preferred embodiment of the operational amplifier buffering circuit of FIG. 4.

Voltage control signal $V_{ct2}$ is transmitted to terminal 108b through operational amplifier buffering circuit 112, a preferred embodiment of which is shown in FIG. 6. Voltage control signal $V_{ct2}$ is initially input into an operational amplifier buffering stage 200 preferably utilizing large PMOS input transistors in order to minimize its flicker noise contribution. The output of buffering stage 200 is transmitted to a second operational amplifier stage 202, which is preferably an NMOS transistor 202. A compensation branch 204 including a capacitor 206 and a resistor 208 is also connected between the output of buffering stage 200 and terminal 108*b*. The compensation branch 204 determines the closed loop bandwidth of the operational amplifier buffering circuit 112. The open loop gain of the operational amplifier buffering circuit 112 is sufficiently high to enable the voltage control signal $V_{cr2}$ to be substantially exactly transferred to terminal 108*b* within the buffer loop band width of the operational amplifier buffering circuit 112. The entire LC-VCO 100 with its main current source 106 acts as a high impedance load for the second operational amplifier stage 202. The operational amplifier buffering stage 200 also provides a current path for the current emitted from current source 106.

The preferred embodiment of the present invention utilizes PMOS transistors for the cross-coupled transistor pair 104*a*, 104*b* in the core of the LC-VCO 100. The use of PMOS transistors in the core of the LC-VCO 100 provides several advantages. Initially, the polarity of the varactors 120 and 122 can be situated to have the parasitic diodes 130 and 132 at a virtual ground point in order to eliminate any parasitic diode junction problems while allowing the control voltage to change over the whole supply range of the LC-VCO 100 without forward biasing the varactors 120 and 122. Furthermore, the N-well bulk of PMOS transistors 104*a*, 104*b* could be connected to their source so that the drain to bulk diodes will have a constant bias, and hence a constant capacitance, as long as the drain current is constant, regardless of the control voltages $V_{cr1}$, $V_{cr2}$. This significantly reduces the oscillation frequency sensitivity to both ground and supply variations. PMOS transistors are also less susceptible to substrate noise pickup than NMOS transistors, since the PMOS is situated inside of an N-well. Additionally, PMOS flicker (1/f) noise is an order of magnitude lower than that of an NMOS. As can be seen, utilization of PMOS transistors in the core of the LC-VCO 100 provides numerous advantages over traditionally-used NMOS transistors.

In order to integrate the LC-VCO 100 of the present invention into a PLL, a differential charge pump and a differential loop filter are utilized. The differential charge pump provides common mode control to drive the differential LC-VCO 100. Typically, a charge pump is formed using NMOS and PMOS current sources, where the unavoidable mismatches between the NMOS and PMOS current sources result in a net current going to the loop filter even when the PLL is in lock. This current can cause the two differential control voltages to drift independently. If not controlled, the common mode could then drift freely and saturate the charge pump. Further, a common problem with different common mode control schemes is the lack of a clean reference to which the common mode signal can be locked, where the noise on this reference line is directly undesirably coupled to the output.

Figure 7:
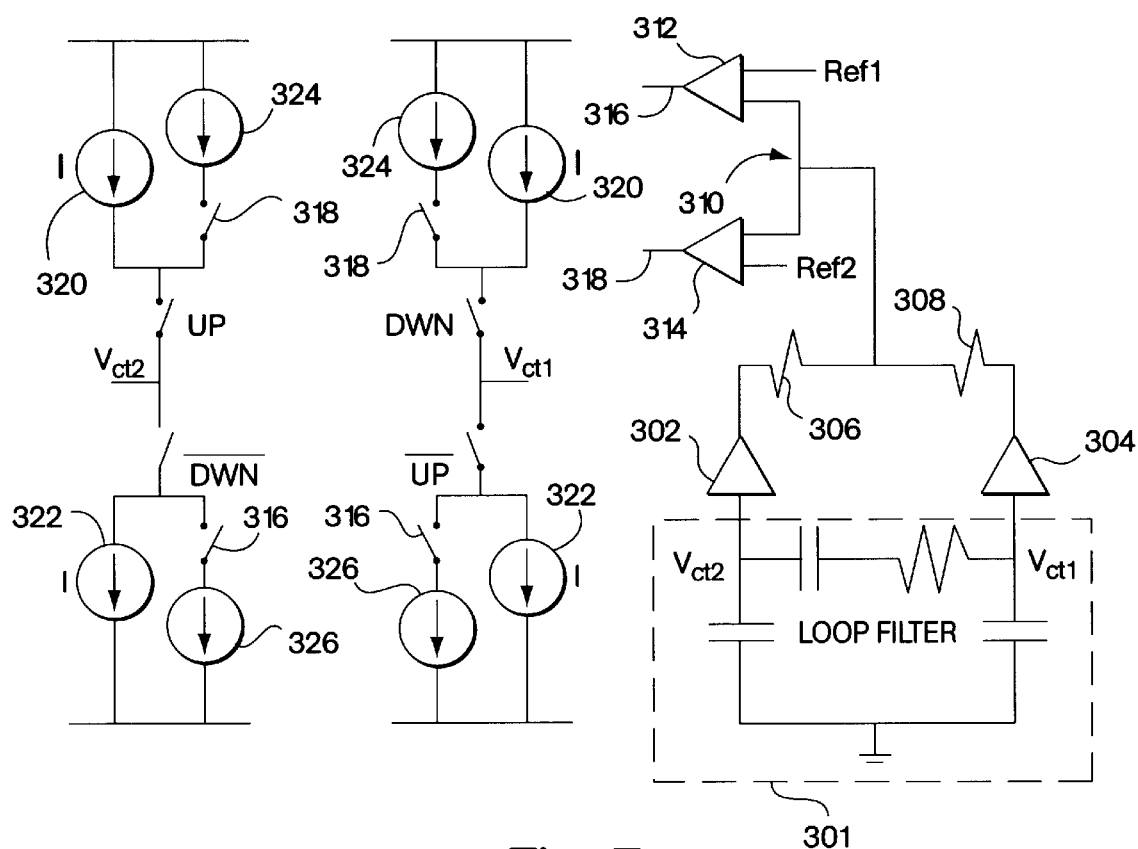
FIG. 7 is a schematic circuit illustration of a preferred embodiment of the differential charge pump and loop filter architecture of the present invention.

The present invention solves the problems typically associated with common mode control by providing the differential charge pump architecture 300 shown in FIG. 7, wherein the differential charge pump 300 includes a differential loop filter 301. The differential charge pump and differential loop filter architecture 300 does not attempt to tie the common mode of the voltage control signals to a fixed reference, but rather forces the common mode signal between two closely spaced references to guarantee that neither the differential charge pump 300 nor the LC-VCO 100 gets saturated. The noise of these two references is not critical as the control circuit works in an open loop mode, and it is off most of the time due to the common mode drift being a relatively slow process.

The differential charge pump 300 utilizes two simple source follower buffers 302 and 304 along with two summing resistors 306 and 308 to detect the common mode value of the two voltage control signals $V_{cr1}$ and $V_{cr2}$. The common mode value signal is fed to a tristate comparison stage 310, which uses two simple comparators 312 and 314 together with two reference signals Ref1 and Ref2 to generate output signals on lines 316 and 318, respectively. Both signals on lines 316 and 318 are zero as long as the common mode is between the two references. Once the common mode drifts beyond this range, one of the comparators will output a one signal, which is used to add an intentional offset to either the positive or the negative current sources depending upon whether the common mode is to be pushed up or down. PMOS current sources 320 provide up charge-pump output currents, while NMOS current sources 322 provide down charge-pump output currents. Connected in parallel to PMOS current sources 320 are respective compensating PMOS current sources 324 which provide fractional currents ΔI(PMOS) to compensate for the common mode drift, while compensating NMOS current sources 326 are similarly arranged in parallel to respective NMOS current sources 322 to provide fractional currents ΔI(NMOS) to compensate for the common mode drift. Compensating PMOS current source 324 is activated when an output signal is generated on line 318, while compensating NMOS current source 326 is activated when an output signal is generated on line 316. The offset current (common mode control) is only switched on when the charge pump is active. The value of the offset current provides enough current to push the common mode to the midway point between the two references in one PLL reference frequency cycle. The common mode control loop should be designed carefully to ensure that the common mode does not get pushed beyond the two references to oscillate around the two references and never actually get between them. Either ΔI(PMOS) or ΔI(NMOS) currents are turned on depending on the operation of the comparison stage 310. Compensating current sources 324 and 326 are used to increment their respective PMOS or NMOS currents to correct the common mode voltage.

The implementation of the present invention will now be described with reference to particular circuit design together with simulated result. This example is described merely for the purpose of illustration and does not encompass all possible circuit arrangements which may be used with the LC-VCO 100 of the present invention.

Simulated Results

The LC-VCO 100 and differential charge pump 300 of the present invention were integrated with a simple phase frequency detector and a frequency divider in a test PLL chip. The VCO was designed for a center output frequency of 1.25 GHz. According to H-spice simulation results, the tuning range was about 250 MHz. This tuning range was large enough to achieve the desired 1.25 GHz output and 25 MHz tuning range around it for all process corners, temperature variations from 0–70° C., and supply variations from 2.7–3.6 volts. Using a 0.5 μm CMOS process and a supply voltage of 3.0 volts, the LC-VCO core drew 3.6 mA. The differential amplifier for the buffering stage consumed 440 μA. The LC-VCO output was capacitively coupled to a 2.1 mA simple open drain differential stage that drives a 50 Ω load for testing. Parallel to this buffering stage another source follower stage was used to drive the capacitive prescaler inputs, which consumed 1.0 mA. The capacitive coupling is necessary in this case because the DC level of the VCO output varies with the control signal.

For the differential control input, the buffering stage 112 was designed with large PMOS input transistors in order to minimize its flicker noise contribution. They were also biased at relatively high currents to reduce their thermal noise. The buffer closed loop bandwidth, determined by the compensation branch, is 4 MHz within which the differential control common mode rejection is above 1,000. This bandwidth is well beyond the PLL loop bandwidth, and it should reject any common mode noise within the loop bandwidth. This is also important to avoid degrading the PLL stability due to the extra pole. The settling time of the LC-VCO output due to the buffer loop transients is around 100 ns, which is much faster than the loop transients. The resistance $R_{ct}$ together with capacitance 128 acts as a low pass filter for the direct control signal $V_{ct1}$ with a bandwidth equal to that of the other control signal, in order to slow down the common mode degradation for higher frequencies. With the VCO output tuned for 1.25 GHz, the third harmonic is almost −40 dBc, while the second harmonic for a single ended output is −24 dBc.

Phase Noise Estimation

The LC-VCO phase noise output is caused by both internal and external sources. The internal phase noise is commonly estimated using Leeson's formula:

$$S_n(\Delta\omega) = \frac{1}{2} \frac{FkT}{C} \left[ \frac{1}{4Q^2} \left(\frac{w_o}{\Delta\omega}\right)^2 + 1 \right] \left[ \frac{w_c}{\Delta\omega} + 1 \right]$$

where F is the amplifier noise figure at full output, C is the oscillator output power, Q is the resonator quality factor, $w_o$ is the oscillation frequency, $\Delta w$ is the offset frequency at which the noise is to be calculated, and finally $w_c$ is the 1/f noise corner of the amplifier.

The factor FkT/C represents the thermal noise to signal power ratio of the LC-VCO amplifier. The quantity in the first brace represents the noise shaping due to the selective feedback circuitry, where the 1.0 accounts for the thermal noise floor away from the center frequency. The quantity in the second brace accounts for the amplifier 1/f flicker noise. It is also important to note that the ½ factor at the beginning of the equation takes care of the fact that only 50% of the shaped noise power acts as phase modulation (PM) while the rest is amplitude modulation (AM). The equation also addresses the contribution of different thermal noise sources to this relation in a typical oscillator.

The phase noise due to external sources, or the varactor modulation noise, can be described using the small phase deviation index approximation of the phase modulation theory which relates the single sideband noise modulation power, normalized to 1 Hz, to the carrier power as:

$$S_{n\_var\ actor}(\Delta\omega) = \frac{1}{2}\Delta\phi_{rms}^2$$

$$\Delta\phi_{rms} = \frac{\Delta\omega_{rms}}{\Delta\omega}$$

$$\Delta\omega_{rms} = 2\pi V_{n\_var\_in\_rms} K_{vco}$$

$$S_{n\_var\ actor}(\Delta\omega) = \frac{1}{2}\left(\frac{2\pi V_{n\_var\_in\_rms} K_{vco}}{\Delta\omega}\right)^2$$

The factor ½ is the asymptotic value of the fist order Bessel function, representing the frequency components of a phase modulated (PM) signal, for small phase deviations, $K_{VCO}$ is the VCO gain defined as the output frequency change per one volt change in the control input. It should be noted that the above equation is valid only for small values of phase deviation ($\Delta\phi_{pk} \ll 1$ radian), which should always be the case for the type of applications for the present invention. The control circuit was designed very carefully to minimize the effect of this varactor modulation noise.

In order to estimate the output phase noise, the VCO core is simulated in an open loop condition using linear H-spice AC analysis to get the equivalent output noise voltage. This equivalent voltage is then used to calculate the value of the factor F in Leeson's formula as:

$$F = \frac{V_{noise}^2}{kTR_p}$$

where $R_p$ is the equivalent parallel tank resistance at the oscillation frequency. Using a tank inductance of 4.3 nH and a total capacitance of 3.77 pF at the center frequency of 1.25 GHz, the equivalent tank Q was estimated to be 5.7 and Rp=189 Ω. This leads to a calculated factor F of 20 and a phase noise of around −100 dBc@100 kHz offset frequency.

To estimate the noise added by the control circuitry, AC analysis of the control buffer was used to calculate its noise contribution. The simulated thermal noise level at the varactor input was around 5.7 nV/√Hz with (1/f) flicker noise corner frequency of 11 kHz. For a VCO gain of 85 MHz/volt, the varactor modulation noise was estimated to be −109 dBc@100 kHz, meaning only a 0.5 dB degradation in the phase noise.

Measured Results

The circuit architecture of the present invention used for the simulated results was tested, where the loop was closed with a fixed division ratio of 50. The input reference was swept from 22.35 MHz to 29.72 MHz to cover the full VCO range, where the loop locked correctly over the whole range confirming that the common mode control architecture was functioning properly. The current consumption was found to be 3.6 mA for the VCO core, 0.44 mA for the buffer operational amplifier, 1 mA for the prescaler buffer, 2.1 mA for the output buffer, and 0.1 mA for the charge pump common mode control, all at a 3 volt supply. The charge pump current was designed to be 0.3 mA.

Figure 8:
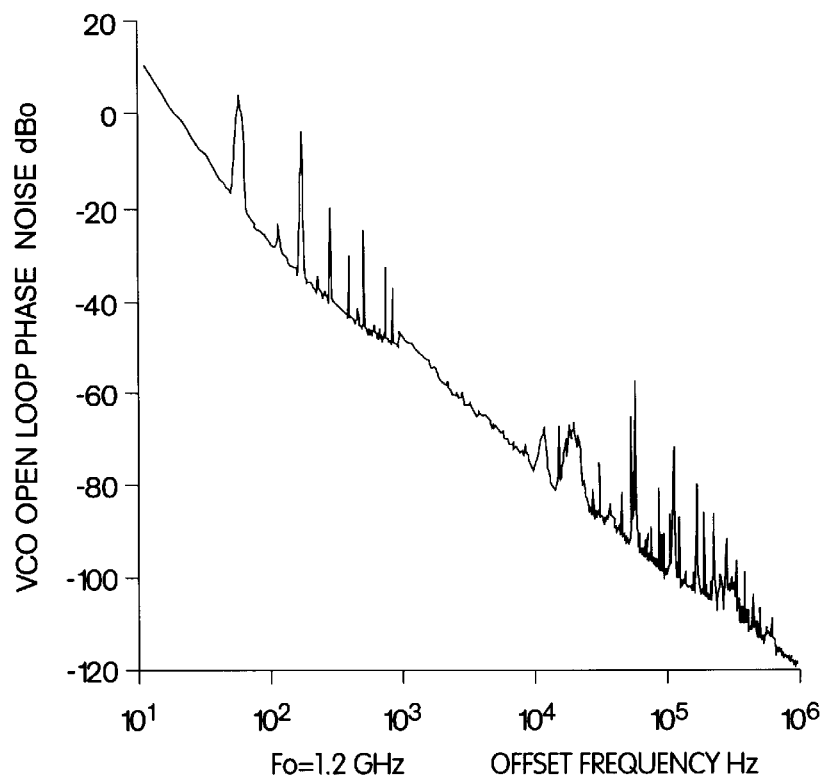
FIG. 8 is a graphical illustration of the measured open loop phase noise at a carrier frequency of 1.2 GHz for one embodiment of the LC-VCO of the present invention.
Figure 9:
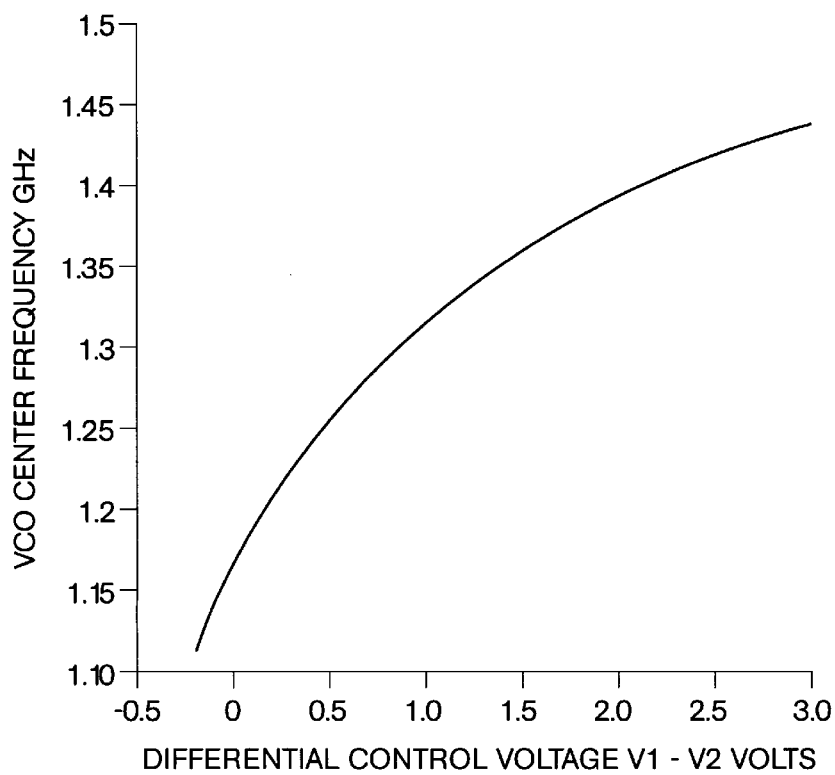
FIG. 9 is a graphical illustration the measured output frequency of one embodiment of the LC-VCO over the entire differential tuning range.

The measured open loop VCO phase noise at a carrier frequency of 1.2 GHz is shown in FIG. 8. The measured values of −99 dBc@100 KHz and −119 dBc@1.0 MHz were found to be very close to the simulated values. This confirms that the contribution of the control circuit is very small. Referring to FIG. 9, the measured VCO output frequency over the entire differential ($V_{ct1}-V_{ct2}$) VCO tuning range from 1.115 GHz at −0.2 volts with the varactors slightly forward to 1.440 GHz at 3.0 volts is shown. Changing the common mode of the control voltage from 0.2 volts to 1.7 volts has changed the output frequency by only 140 kHz, which means excellent common mode rejection of more than 2000 at DC. These simulated and measured results illustrate the improved noise immunity achieved in the present invention, but the circuit architecture utilized in these examples is not intended to encompass all of the component values and configurations of the present invention.

As can be seen from the foregoing, a differentially controlled LC-VCO, charge pump, and loop filter architecture formed in accordance with the present invention utilizes an operational amplifier buffer in differentially controlling a CMOS LC-VCO with a very small degradation in the phase noise and no reduction in the tuning range. There is only a minimal increase of the power consumption of the differential LC-VCO over that of a single-ended control, less than 10%. Moreover, by forming a differentially controlled LC-VCO, charge pump, and loop filter architecture formed in accordance with the present invention, a simple open loop common mode control is used by a differential charge pump in a fully integrated PLL. The open loop nature of the common mode control circuit eliminates the need for a clean voltage reference and uses two crude references instead. Furthermore, the differential control of the LC-VCO reduces sensitivity to supply, ground, and substrate noise.

In each of the above embodiments, the structures of the differentially controlled LC-VCO, charge pump, and loop filter architecture of the present invention are described separately in each of the embodiments. However, it is the full intention of the inventors of the present invention that the separate aspects of each embodiment described herein may be combined with the other embodiments described herein. Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A differentially controlled LC-based voltage-controlled oscillator (VCO), comprising:
    a transistor core;
    a varactor tuning circuit connected to the transistor core for tuning an operating frequency of the VCO; and
    a pair of voltage inputs connected to respective nodes of the varactor tuning circuit for differentially controlling the varactor circuit with respective voltage signals supplied over the voltage inputs.

2. The LC-VCO of claim 1, further comprising an operational amplifier buffering circuit positioned between one of the voltage inputs and one of the nodes of the varactor tuning circuit.

3. The LC-VCO of claim 2, wherein the operational amplifier buffering circuit provides a DC current path for the LC-VCO.

4. The LC-VCO of claim 1, wherein the transistor core includes a pair of cross-coupled PMOS transistors.

5. The LC-VCO of claim 1, wherein the voltage signals are supplied over the pair of voltage inputs in a differential mode, where all unwanted signals from other sources are common mode and not sensed by the varactor tuning circuit.

6. The LC-VCO of claim 1, wherein the LC-VCO is integrated into a phase-locked loop (PLL).

7. The LC-VCO of claim 6, wherein the voltage control signals are provided to the pair of voltage inputs by a differential charge pump.

8. The LC-VCO of claim 7, wherein the voltage control signals each have an average value maintained within a predetermined voltage range between two reference voltages.

9. The LC-VCO of claim 1, wherein the differential control of the LC-VCO reduces its sensitivity to supply, ground, and substrate noise.

10. A differentially controlled LC-based voltage-controlled oscillator (VCO), comprising:
    an LC circuit architecture which determines an operating frequency of the VCO;
    wherein the LC circuit architecture includes a varactor tuning circuit having nodes on opposite ends of the varactor tuning circuit; and
    a pair of voltage inputs connected to respective nodes of the varactor tuning circuit for differentially controlling the varactor circuit with respective voltage signals supplied over the voltage inputs.

11. The LC-VCO of claim 9, further comprising an operational amplifier buffering circuit positioned between one of the voltage inputs and one of the nodes of the varactor tuning circuit.

12. The LC-VCO of claim 11, wherein the operational amplifier buffering circuit provides a DC current path for the LC-VCO.

13. The LC-VCO of claim 10, further comprising a pair of cross-coupled PMOS transistors connected to the LC circuit architecture.

14. The LC-VCO of claim 10, wherein the voltage signals are supplied over the pair of voltage inputs in a differential mode, where all unwanted signals from other sources are common mode and not sensed by the varactor tuning circuit.

15. The LC-VCO of claim 10, wherein the LC-VCO is integrated into a phase-locked loop (PLL).

16. The LC-VCO of claim 15, wherein the voltage signals are provided to the pair of voltage inputs by a differential charge pump.

17. The LC-VCO of claim 16, wherein the voltage signals each have an average value maintained within a predetermined voltage range between two reference voltages.

18. A phase-locked loop including an integrated differential LC-based voltage-controlled oscillator (VCO) and charge pump and loop filter architecture, comprising:
    a differential charge pump and loop filter for producing a pair of voltage control signals; and
    an LC-based VCO having a varactor tuning circuit core for tuning an operating frequency of the LC-VCO, wherein the varactor tuning circuit includes a pair of nodes arranged to receive respective voltage control signals;
    wherein the pair of voltage control signals are supplied to respective nodes of the varactor tuning circuit for differentially controlling the varactor tuning circuit.

19. The PLL of claim 18, wherein the LC-VCO further comprises an operational amplifier buffering circuit positioned between the differential charge pump and loop filter and one of the nodes of the varactor tuning circuit.

20. The PLL of claim 19, wherein the operational amplifier buffering circuit provides a DC current path for the LC-VCO.

21. The PLL of claim 18, wherein the LC-VCO further includes a pair of cross-coupled PMOS transistors connected to the varactor tuning circuit.

22. The PLL of claim 18, wherein the voltage control signals are supplied over the pair of nodes in a differential mode, where all unwanted signals from other sources are common mode and not sensed by the varactor tuning circuit.

23. The PLL of claim 18, wherein the differential control of the LC-VCO reduces its sensitivity to supply, ground, and substrate noise.

24. The PLL of claim 18, wherein the differential charge pump and loop filter includes a tristate comparison circuit which ensures that the voltage control signals remain within a predetermined voltage range between two reference voltages.

25. A method of differentially controlling an LC-based voltage-controlled oscillator (VCO), comprising the steps of:
    generating a pair of voltage control signals;
    supplying the voltage control signals to respective nodes of a varactor tuning circuit in the LC-VCO;

controlling the operating frequency of the LC-VCO by variably controlling the voltages of the voltage control signals supplied to the varactor tuning circuit.

26. The method of claim 25, wherein the pair of voltage control signals are generated in a differential mode, where all unwanted signals from other sources are common mode and not sensed by the varactor tuning circuit.

27. The method of claim 25, further comprising the step of comparing the voltage control signals with two reference voltages to ensure that the average values of the voltage control signals remain within a predetermined voltage range between the two reference voltages.

28. The method of claim 27, further comprising the step of adjusting the voltage control signals if it is determined that any of the voltage control signals have deviated from the predetermined range.

29. The method of claim 28, wherein the voltage control signals are adjusted by incrementing either a positive charge pump current or a negative charge pump current.

30. The method of claim 25, further comprising the step of passing one of the voltage control signals through an operational amplifier buffering circuit before being supplied to its respective node on the varactor tuning circuit.

31. The method of claim 30, wherein the operational amplifier buffering circuit provides a DC current path for the LC-VCO.

* * * * *